(12) United States Patent
Park et al.

(10) Patent No.: US 12,407,770 B2
(45) Date of Patent: Sep. 2, 2025

(54) ELECTRONIC DEVICE INCLUDING CABLE CONNECTOR

(71) Applicant: Samsung Electronics Co., Ltd., Gyeonggi-do (KR)

(72) Inventors: Sungwu Park, Gyeonggi-do (KR); Sangmin Lee, Gyeonggi-do (KR); Junhee Han, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 266 days.

(21) Appl. No.: 17/994,058

(22) Filed: Nov. 25, 2022

(65) Prior Publication Data

US 2023/0156107 A1 May 18, 2023

Related U.S. Application Data

(63) Continuation of application No. PCT/KR2022/018253, filed on Nov. 18, 2022.

(30) Foreign Application Priority Data

Nov. 18, 2021 (KR) .................. 10-2021-0159468

(51) Int. Cl.
*H04M 1/00* (2006.01)
*H01R 12/73* (2011.01)
(Continued)

(52) U.S. Cl.
CPC ........ *H04M 1/0274* (2013.01); *H01R 12/732* (2013.01); *H04M 1/0277* (2013.01); *H05K 1/189* (2013.01); *H05K 9/0081* (2013.01)

(58) Field of Classification Search
None
See application file for complete search history.

(56) References Cited

U.S. PATENT DOCUMENTS

| 7,320,605 | B2* | 1/2008 | Chang | H01R 12/52 |
| | | | | 439/74 |
| 8,398,425 | B2* | 3/2013 | Suzuki | H01R 13/631 |
| | | | | 439/374 |

(Continued)

FOREIGN PATENT DOCUMENTS

| CN | 210225475 U | 3/2020 |
| JP | 11-144823 A | 5/1999 |

(Continued)

OTHER PUBLICATIONS

International Search Report dated Mar. 2, 2023.

*Primary Examiner* — Imani N Hayman
*Assistant Examiner* — Rashen E Morrison
(74) *Attorney, Agent, or Firm* — Cha & Reiter, LLC.

(57) ABSTRACT

An electronic device is disclosed, including: a plurality of electrical components, a substrate including a circuit electrically connected to the electrical component, wherein a through hole is formed penetrating the substrate in a thickness direction from an upper surface of the substrate, a cable, a head part coupled to an end portion of the cable, and a socket part including a contact pin of which at least a portion thereof is disposed inside the through hole and extends laterally with respect to a lower surface of the substrate, so as to be electrically connected to the substrate, and coupled to the head part in a direction of the upper surface of the substrate.

15 Claims, 20 Drawing Sheets

(51) Int. Cl.
  *H04M 1/02*  (2006.01)
  *H05K 1/18*  (2006.01)
  *H05K 5/00*  (2025.01)
  *H05K 9/00*  (2006.01)

(56) References Cited

U.S. PATENT DOCUMENTS

| | | | |
|---|---|---|---|
| 9,124,011 B2* | 9/2015 | Miyazaki | H01R 13/6271 |
| 9,307,644 B2* | 4/2016 | Kim | H01R 13/629 |
| 9,344,539 B2* | 5/2016 | Wang | G06F 1/1626 |
| 9,484,648 B2* | 11/2016 | Takenaga | H01R 12/716 |
| 10,148,031 B2* | 12/2018 | Tan | H01R 13/514 |
| 10,389,007 B1* | 8/2019 | Choi | H01Q 21/08 |
| 10,726,258 B2* | 7/2020 | Park | H04N 23/51 |
| 11,398,697 B2* | 7/2022 | Komoto | H01R 43/205 |
| 11,799,192 B2* | 10/2023 | Baek | H04B 5/24 |
| 2004/0157478 A1* | 8/2004 | Midorikawa | H01R 12/73 |
| | | | 439/74 |
| 2013/0171876 A1* | 7/2013 | Funahashi | H01R 24/50 |
| | | | 439/620.03 |
| 2014/0171159 A1* | 6/2014 | Endo | H01Q 1/243 |
| | | | 343/904 |
| 2014/0232607 A1* | 8/2014 | Lee | H04B 15/04 |
| | | | 343/841 |
| 2015/0323755 A1* | 11/2015 | Kwon | G02B 7/023 |
| | | | 359/823 |
| 2017/0171440 A1* | 6/2017 | Park | G02B 7/08 |
| 2019/0012544 A1* | 1/2019 | Park | H04N 25/70 |
| 2019/0208045 A1* | 7/2019 | Xie | H05K 1/189 |
| 2019/0312334 A1* | 10/2019 | Shin | H04M 1/0249 |
| 2020/0288004 A1* | 9/2020 | Ren | G06F 3/041 |
| 2021/0006648 A1* | 1/2021 | Han | H01R 12/716 |
| 2021/0120113 A1* | 4/2021 | Shim | H04M 1/026 |
| 2021/0243291 A1 | 8/2021 | Lim et al. | |
| 2022/0201860 A1* | 6/2022 | Kim | H05K 1/181 |
| 2024/0089367 A1* | 3/2024 | Shim | H01Q 1/24 |

FOREIGN PATENT DOCUMENTS

| | | |
|---|---|---|
| JP | 2002-42985 A | 2/2002 |
| JP | 3396343 B2 | 4/2003 |
| JP | 2006-261543 A | 9/2006 |
| JP | 2013-106195 A | 5/2013 |
| JP | 2014-120076 A | 6/2014 |
| JP | 5790245 B2 | 10/2015 |
| JP | 2020-191185 A | 11/2020 |
| KR | 10-2008-0036813 A | 4/2008 |
| KR | 10-2013-0012915 A | 2/2013 |
| KR | 10-2016-0076733 A | 7/2016 |
| KR | 10-2019-0103814 A | 9/2019 |
| KR | 10-2021-0099264 A | 8/2021 |

* cited by examiner

ELECTRONIC DEVICE INCLUDING CABLE CONNECTOR

CROSS-REFERENCE TO RELATED APPLICATION(S)

This is a continuation application that is based on and claims priority under 35 U.S.C. § 120 to PCT International Application No. PCT/KR2022/018253 which was filed on Nov. 18, 2022, and claims priority to Korean Patent Application No. 10-2021-0159468, filed on Nov. 18, 2021, in the Korean Intellectual Property Office, the disclosures of which are incorporated by reference herein their entirety.

TECHNICAL FIELD

Certain embodiments disclosed in this document relate to an electronic device, and more particularly, to an electronic device including an internal cable connector.

DESCRIPTION OF RELATED ART

Electronic devices include circuit boards. Circuit boards provide space and circuitry for disposing electrical connections between electronic components such as integrated circuits, passive elements, sensors, and cables for connection. The electrical components may be disposed directly on a surface of the circuit board, or be electrically connected to the circuit board through the cable.

A cable maybe utilized for transmitting a signal or supplying power, such as a coaxial cable, a ribbon cable, or a flexible cable. The cable may be positioned within the electronic device. The cable may include a male connector on an end portion thereof, and the circuit board may include a female connector to which a male connector is coupled.

The male connector may be disposed within a header that includes a stiffener providing rigidity for insertion into the female connector by an operator, or a robot during assembly of the electronic device. The female connector may be disposed in a socket to which the header is coupled, and the socket may be disposed on the circuit board via a dip pin, soldering, or surface mount technology (SMT).

SUMMARY

When the female connector is disposed on a surface of the substrate in a direction so as to be coupled to the male connector, the socket and the header may protrude on the surface of the substrate. Thus, an excessively high height may be required for disposition of a cable connector, and adversely affect disposition of other components within the electronic device, and increase an overall thickness of the electronic device. Further, an increase in disposition height of the cable connector may increase a gap with a shielding material providing electromagnetic interference (EMI) shielding, thereby rendering EMI shielding incomplete.

Certain embodiments disclosed in this document may provide an electronic device including a cable connector having a reduced disposition height.

According to certain embodiments of the disclosure, an electronic device including a plurality of electrical components may include a substrate including a circuit electrically connected to the electrical component, wherein a through hole is formed penetrating the substrate in a thickness direction from an upper surface of the substrate, a cable, a head part coupled to an end portion of the cable, and a socket part including a contact pin of which at least a portion thereof is disposed inside the through hole and extends laterally with respect to a lower surface of the substrate, so as to be electrically connected to the substrate, and coupled to the head part in a direction of the upper surface of the substrate.

In some embodiments, the electronic device may further include

In some embodiments, the substrate may include an anchor fixed to the substrate by penetrating the substrate in a thickness direction, and configured to fix the support member to a lower surface thereof. In some embodiments, the electronic device may further include an auxiliary substrate positioned, in an area including an area in which the through hole is formed, on the lower surface of the substrate. In some embodiments, the substrate may include a first contact pad formed on a lower surface of the substrate and bonded to the contact pin of the socket part; and a plurality of second contact pads formed on the lower surface of the substrate and electrically connected to the circuit of the substrate, wherein the auxiliary substrate may include a bypass wiring coupled to the second contact pads to interconnect at least two of the second contact pads. In other embodiments, the auxiliary substrate may include a socket connection wiring bonded to the substrate and the contact pin of the socket part.

The contact pin may be electrically connected to the substrate through the socket connection wiring of the auxiliary substrate. In some embodiments, a thickness of the auxiliary substrate may be thinner than that of the substrate. In other embodiments, the auxiliary substrate may include a flexible printed circuit board.

In some embodiments, the electronic device may further include a second substrate positioned in a lower portion of the substrate and in which at least some of the electrical components are disposed. In some embodiments, the substrate may include a first contact pad formed on a lower surface of the substrate and bonded to the contact pin of the socket part; a plurality of second contact pads formed on the lower surface of the substrate and electrically connected to the circuit of the substrate, wherein the second substrate may include a bypass wiring coupled to the second contact pads to interconnect at least two of the second contact pads. In other embodiments, the second substrate may include a socket connection wiring bonded to the substrate and the contact pin of the socket part, and the contact pin may be electrically connected to the substrate through the socket connection wiring of the second substrate. In some embodiments, the electronic device may further include an interposer substrate interposed between the substrate and the second substrate, wherein the interposer substrate may include a via configured to electrically connect the substrate and the second substrate.

In some embodiments, the substrate may include a first contact pad formed on a lower surface thereof and bonded to the contact pin of the socket part; and a plurality of second contact pads formed on the lower surface thereof and electrically connected to the circuit thereof, wherein the interposer substrate may include a bypass wiring coupled to the second contact pads to interconnect at least two of the second contact pads. In some embodiments, the interposer substrate may include a socket connection wiring bonded to the substrate and the contact pin of the socket part, and the contact pin may be electrically connected to the substrate through the socket connection wiring of the interposer substrate.

In some embodiments, the electronic device may further include a shielding member configured to cover an upper surface and a side surface of the head part and including a conductive material. In some embodiments, the shielding member may be formed by cutting the conductive material on the thin plate into a shape including a central portion and a plurality of side shielding parts extended radially from the central portion and by bending the side shielding part to cover the side surface of the head part. In some embodiments, the shielding member may be formed by cutting the conductive material on a thin plate into a T-shape or a plus (+) shape.

According to certain embodiments disclosed in this document, because a socket is disposed at least partly in a through hole formed in the substrate, a height for disposing a cable connector on a substrate surface may be reduced. Thus, an electronic device equipped as such may be designed so as to have a reduced thickness, and improved EMI shielding capability may be provided.

BRIEF DESCRIPTION OF THE DRAWINGS

In connection with the description of the drawings, the same or similar reference numerals may be used for the same or similar components.

DETAILED DESCRIPTION

Figure 1:
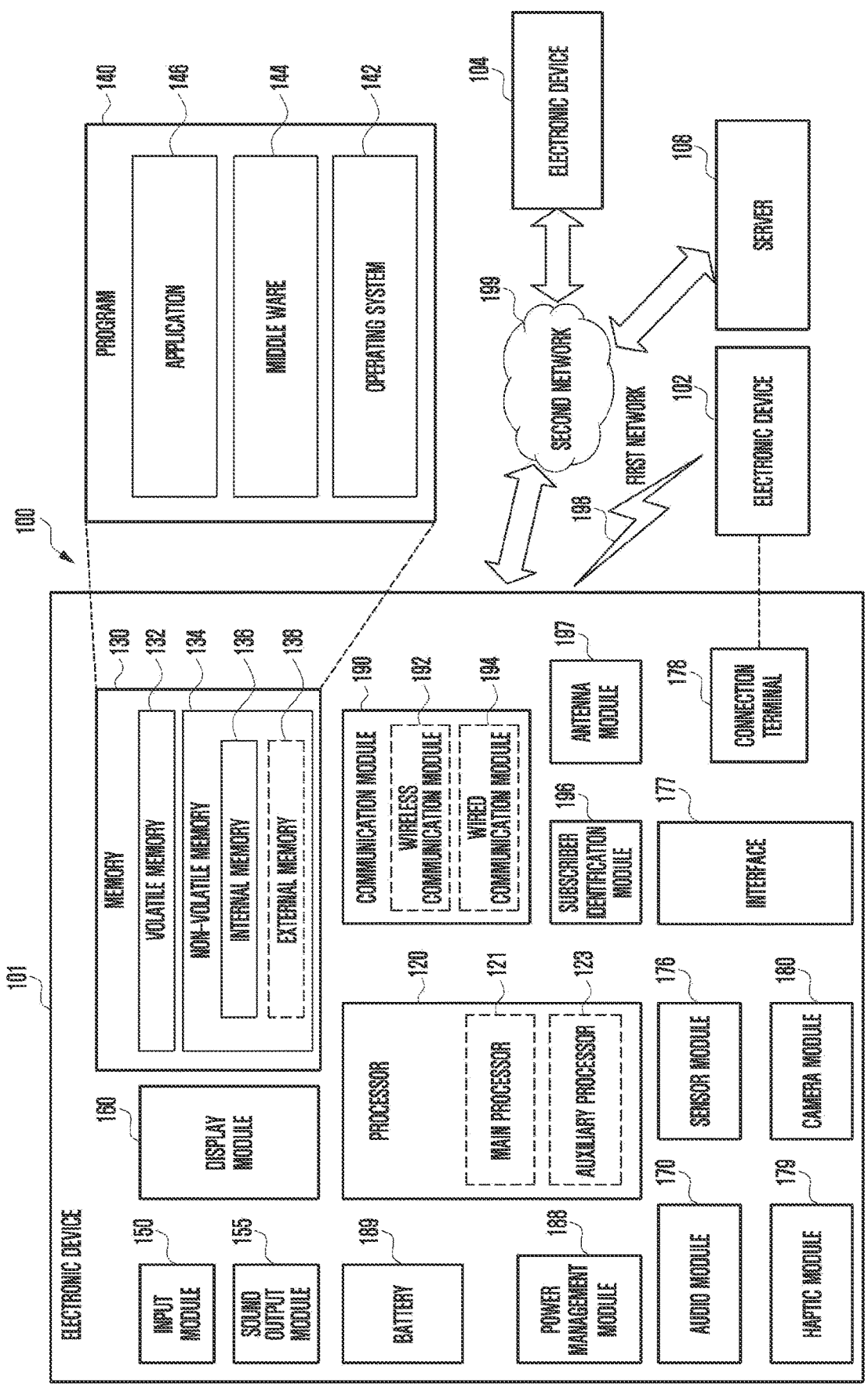
FIG. 1 is a block diagram illustrating an example electronic device in a network environment according to certain embodiments.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input 1 module 150, a sound output 1 module 155, a display 1 module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the 11 connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160). 11

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display 1 module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input 1 module 150 may receive a command or data to be used by another component (e.g., the processor 120) of the electronic device 101, from the outside (e.g., a user) of the electronic device 101. The input 1 module 150 may include, for example, a microphone, a mouse, a keyboard, a key (e.g., a button), or a digital pen (e.g., a stylus pen).

The sound output 1 module 155 may output sound signals to the outside of the electronic device 101. The sound output 1 module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display 1 module 160 may visually provide information to the outside (e.g., a user) of the electronic device 101. The display 1 module 160 may include, for example, a display, a hologram device, or a projector and control circuitry to control a corresponding one of the display, hologram device, and projector. According to an embodiment, the display 1 module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input 1 module 150, or output the sound via the sound output 1 module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element implemented using a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example.

Figure 2A:
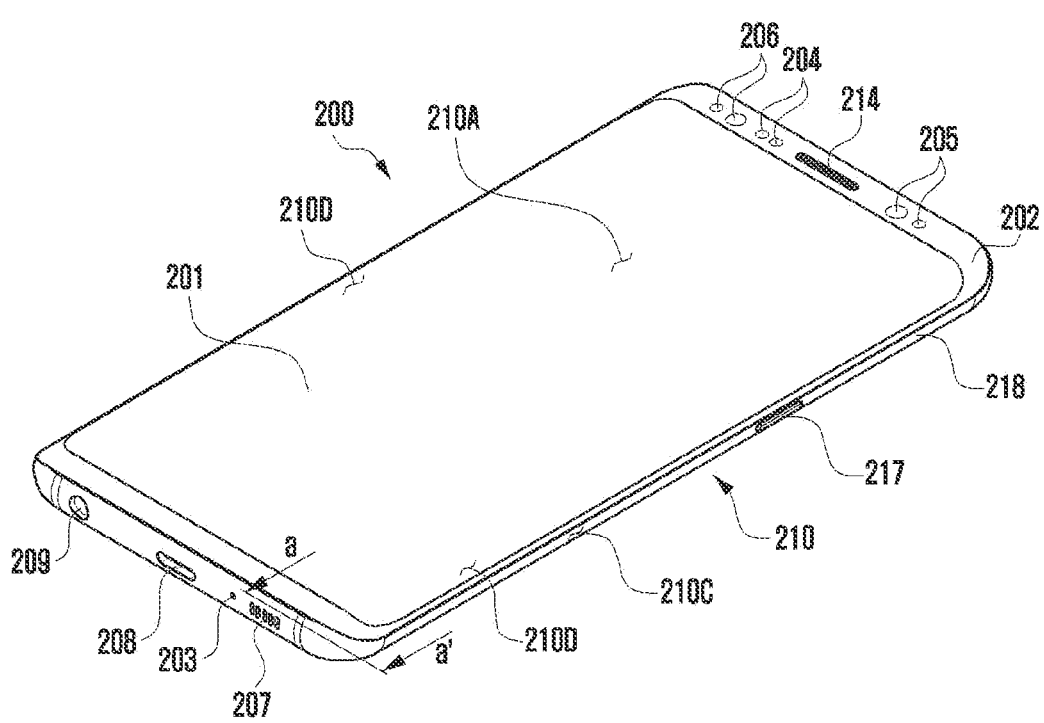
FIG. 2A is a perspective view illustrating an example front surface of an electronic device according to certain embodiments of the disclosure.

FIG. 2A is a perspective view illustrating a front surface of an electronic device according to certain embodiments of the disclosure.

Figure 2B:
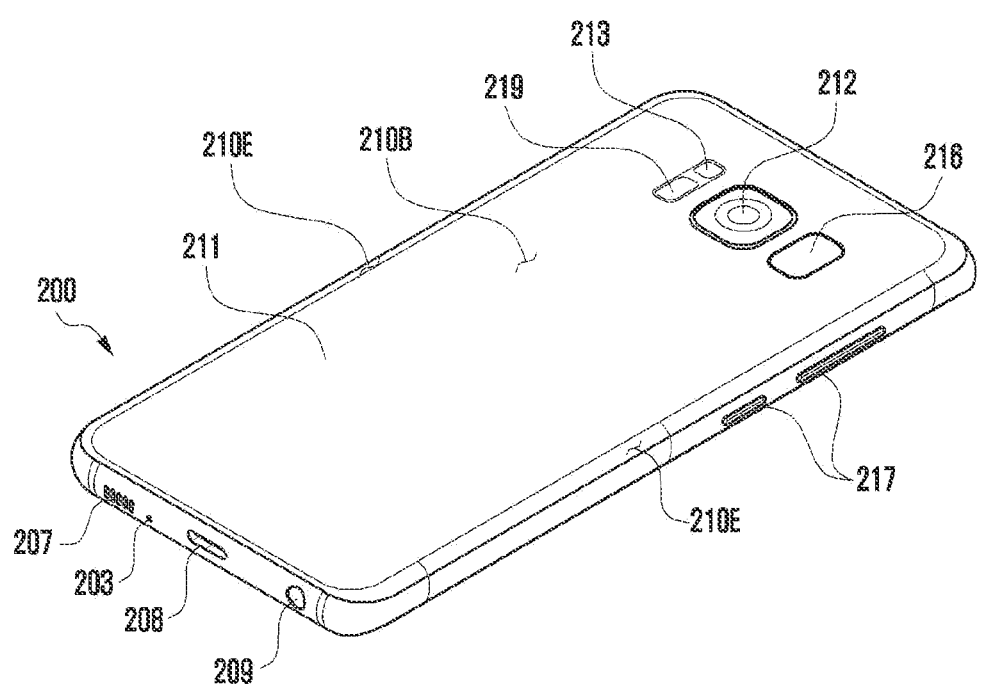
FIG. 2B is a perspective view illustrating a rear surface of an example electronic device according to certain embodiments of the disclosure.

FIG. 2B is a perspective view illustrating a rear surface of an electronic device according to certain embodiments of the disclosure.

With reference to FIGS. 2A and 2B, an electronic device 200 according to an embodiment may include a housing 210 including a first surface (or front surface) 210A, a second surface (or rear surface) 210B, and a side surface 210C enclosing a space between the first surface 210A and the second surface 210B. In another embodiment (not illustrated), the housing may refer to a structure forming a portion of the first surface 210A, the second surface 210B, and the side surface 210C of FIG. 2A. According to an embodiment, the first surface 210A may be formed by a front plate 202 (e.g., a polymer plate or a glass plate including various coating layers) that is at least partially substantially transparent. The second surface 210B may be formed by a substantially opaque rear plate 211. The rear plate 211 may be formed by, for example, coated or colored glass, ceramic, polymer, metal (e.g., aluminum, stainless steel (STS), or magnesium), or a combination of at least two of the above materials. The side surface 210C may be coupled to the front plate 202 and the rear plate 211 and be formed by a side bezel structure (or "side member") 218 including a metal and/or a polymer. In some embodiments, the rear plate 211 and the side bezel structure 218 may be integrally formed and include the same material (e.g., a metal material such as aluminum).

In the illustrated embodiment, the front plate 202 may include two first areas 210D extended seamlessly by bending from the first surface 210A toward the rear plate 211 in both ends of a long edge thereof. In the illustrated embodiment (see FIG. 2B), the rear plate 211 may include two second areas 210E extended seamlessly by bending from the second surface 210B toward the front plate 202 at both ends of the long edge. In some embodiments, the front plate 202 (or the rear plate 211) may include one of the first areas 210D (or the second areas 210E). In another embodiment, the front plate 202 (or the rear plate 211) may not include some of the first areas 210D or the second areas 210E. In the above embodiments, when viewed from the side surface of the electronic device 200, the side bezel structure 218 may have a first thickness (or width) at a side surface that does not include the first areas 210D or the second areas 210E and have a second thickness thinner than the first thickness at the side surface including the first areas 210D or the second areas 210E.

According to an embodiment, the electronic device 200 may include at least one of a display 201, audio modules 203, 207, and 214, sensor modules 204, 216, and 219, camera modules 205, 212, and 213, a key input device 217, a light emitting element 206, or connector holes 208 and 209. In some embodiments, the electronic device 200 may omit at least one (e.g., the key input device 217 or the light emitting element 206) of the components or may additionally include other components.

The display 201 may be visually exposed, for example, through a substantial portion of the front plate 202. In some embodiments, at least a portion of the display 201 may be visually exposed through the front plate 202 forming the first surface 210A and the first areas 210D of the side surface 210C. In some embodiments, an edge of the display 201 may be formed to be substantially the same as an adjacent outer shape of the front plate 202. In another embodiment (not illustrated), in order to expand an area in which the display 201 is exposed, the distance between an outer edge of the display 201 and an outer edge of the front plate 202 may be substantially equally formed.

In another embodiment (not illustrated), a recess or opening may be formed in a portion of a screen display area of the display 201, and the electronic device 200 may include at least one of the audio module 214, the sensor module 204, the camera module 205, or the light emitting element 206 aligned with the recess or the opening. In another embodiment (not illustrated), at a rear surface of the screen display area of the display 201, at least one of the audio module 214, the sensor module 204, the camera module 205, a fingerprint sensor 216, or the light emitting element 206 may be formed. In another embodiment (not illustrated), the display 201 may be coupled to or be disposed to adjacent to a touch sensing circuit, a pressure sensor capable of measuring the intensity (pressure) of a touch, and/or a digitizer that detects a magnetic field type stylus pen. In some embodiments, at least a portion of the sensor modules 204 and 219 and/or at least a portion of the key input device 217 may be disposed in the first areas 210D and/or the second areas 210E.

The audio modules 203, 207, and 214 may include a microphone hole and speaker holes. A microphone for acquiring an external sound may be disposed inside the microphone hole, and in some embodiments, a plurality of microphones may be disposed to detect a direction of a sound. The speaker holes 207 and 214 may include an external speaker hole and a receiver hole for a call. In some embodiments, the speaker holes and the microphone hole may be implemented into a single hole or a speaker (e.g., piezo speaker) may be formed without the speaker holes.

The sensor modules 204, 216, and 219 may generate electrical signals or data values corresponding to an internal operating state or an external environmental state of the electronic device 200. The sensor modules 204, 216, and 219 may include, for example, a first sensor module 204 (e.g., proximity sensor) disposed at the first surface 210A of the housing 210, a second sensor module (not illustrated) (e.g., fingerprint sensor), a third sensor module 219 (e.g., HRM sensor), and/or a fourth sensor module (e.g., fingerprint sensor) 216 disposed at the second surface 210B of the housing 210. The fingerprint sensor may be disposed at the first surface 210A (e.g., the display 201) as well as the second surface 210B of the housing 210. The electronic device 200 may further include a sensor module (not illustrated), for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor 204.

The camera modules 205, 212, and 213 may include a first camera device 205 disposed at the first surface 210A of the electronic device 200, a second camera device 212 disposed at the second surface 210B of the electronic device 200, and/or a flash 213. The camera devices 205 and 212 may include one or more lenses, an image sensor, and/or an image signal processor. The flash 213 may include, for example, a light emitting diode or a xenon lamp. In some embodiments, two or more lenses (infrared cameras, wide-angle and telephoto lenses) and image sensors may be disposed on one surface of the electronic device 200.

The key input device 217 may be disposed at the side surface 210C of the housing 210. In other embodiments, the electronic device 200 may not include some or all of the above-mentioned key input devices 217, and a non-included key input device 217 may be implemented in another form, such as a soft key, on the display 201. In some embodiments, the key input device may include a sensor module 216 disposed at the second surface 210B of the housing 210.

The light emitting element 206 may be disposed, for example, on the first surface 210A of the housing 210. The light emitting element 206 may provide, for example, state information of the electronic device 200 in the form of light. In another embodiment, the light emitting element 206 may provide, for example, a light source interworked with an operation of the camera module 205. The light emitting element 206 may include, for example, LEDs, IR LEDs, and xenon lamps.

The connector holes 208 and 309 may include a first connector hole 208 capable of receiving a connector (e.g., USB connector) for transmitting and receiving power and/or data to and from an external electronic device and/or a second connector hole (e.g., earphone jack) 209 capable of receiving a connector for transmitting and receiving audio signals to and from an external electronic device.

Figure 3:
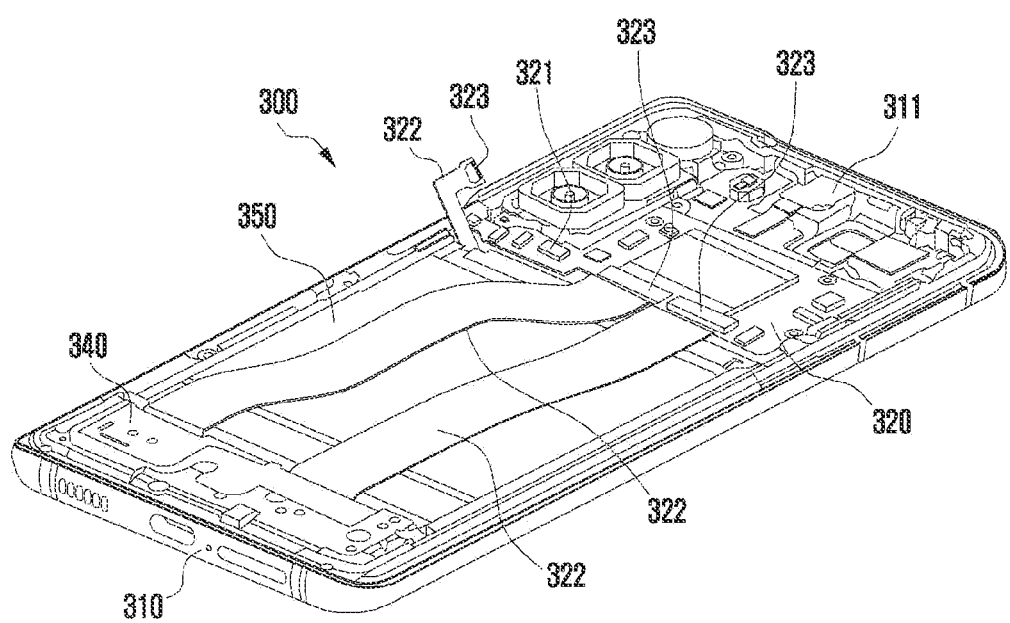
FIG. 3 is an internal perspective view illustrating an example electronic device according to certain embodiments of the disclosure.

FIG. 3 is an internal perspective view illustrating an electronic device according to certain embodiments of the disclosure.

With reference to FIG. 3, an electronic device 300 may include a side bezel structure 310 (e.g., housing), a support member 311 (e.g., bracket), a first printed circuit board 320, a second printed circuit board 340, and a battery 350. In some embodiments, the electronic device 300 may omit at least one of the components or may additionally include other components. At least one of the components of the electronic device 300 may be the same as or similar to at least one of the components of the electronic device 200 of FIG. 2A or 2B, and a duplicate description thereof will be omitted below.

The first support member 311 may be disposed inside the electronic device 300 so as to be connected to the side bezel structure 310 (e.g., housing), or may be integrally formed with the side bezel structure 310. The first support member 311 may be made of, for example, a metal material and/or a non-metal (e.g., polymer) material. The first support member 311 may include a display (not illustrated) coupled to one surface thereof and first, and second printed circuit boards 320 and 340 coupled to the other surface thereof. A processor, a memory, a sensor, a camera, and/or a female connector 321 may be mounted on the first printed circuit board 320. The processor may include, for example, one or more of a central processer, an application processor, a graphic processer, an image signal processor, a sensor hub processor, or a communication processor. In some embodiments, the first printed circuit board may be a laminated substrate on which a plurality of PCBs are stacked.

The female connector 321 electrically connect a cable 322 to the electrical component of the electronic device via coupling to a male connector 323 positioned in an end portion of the cable 322. The term "male" may refer to a connector positioned in an end portion of a cable, and the term "female" may refer to a connector positioned at an object, to which the cable is electrically connected. The female connector and the male connector may be coupled via an interference fit by a frictional force, or snap fit coupling using an elastic lug. In some embodiments, the female connector may include a receiving portion in which a conductive contact portion is formed, and the male connector may have a terminal insertable into the female connector so as to form an electrical contact in the conductive contact portion, but the disclosure is not limited thereto and a configuration opposite to the above-described configuration is also possible.

The cable 322 may be a member that interconnects electrical components such as, for example, the first and second printed circuit boards 320 and 340, an antenna (not illustrated), a camera, and/or a display panel (e.g., the display 201 of FIG. 2A) of the electronic device. In some embodiments, the cable may include a ribbon cable, a coaxial cable, a flexible flat cable (FFC), or a flexible printed cable (FPC). A male connector may be disposed in an end portion of the cable.

The second printed circuit board 340 may include another electrical component of the electronic device, for example, a power management IC (PMIC) external interface, an interface (e.g., USB interface) for transmitting and receiving power and/or data to and from an external electronic device) and/or an interface (e.g., 3.5 mm earphone jack) for transmitting and receiving analog audio signals to and from an external electronic device. The second printed circuit board may include a cable 322 for connection with the first printed circuit board.

The battery 350 may supply power to at least one component of the electronic device 300, and may include, for example, a non-rechargeable primary battery, a rechargeable secondary battery, and/or a fuel cell. At least a portion of the battery 350 may be, for example, disposed on substantially a same plane as that of the first and second printed circuit boards 320 and 340. The battery 350 may be integrally disposed inside the electronic device 300 or may be disposed detachably from the electronic device 300.

The electronic device 300 according to certain embodiments may include an electronic device such as a bar type, a foldable type, a rollable type, a sliding type, a wearable type, and a tablet PC and/or a notebook PC. The electronic device 300 according to certain embodiments of the disclosure is not limited to the above-described example, and may include various other electronic devices.

Figure 4A:
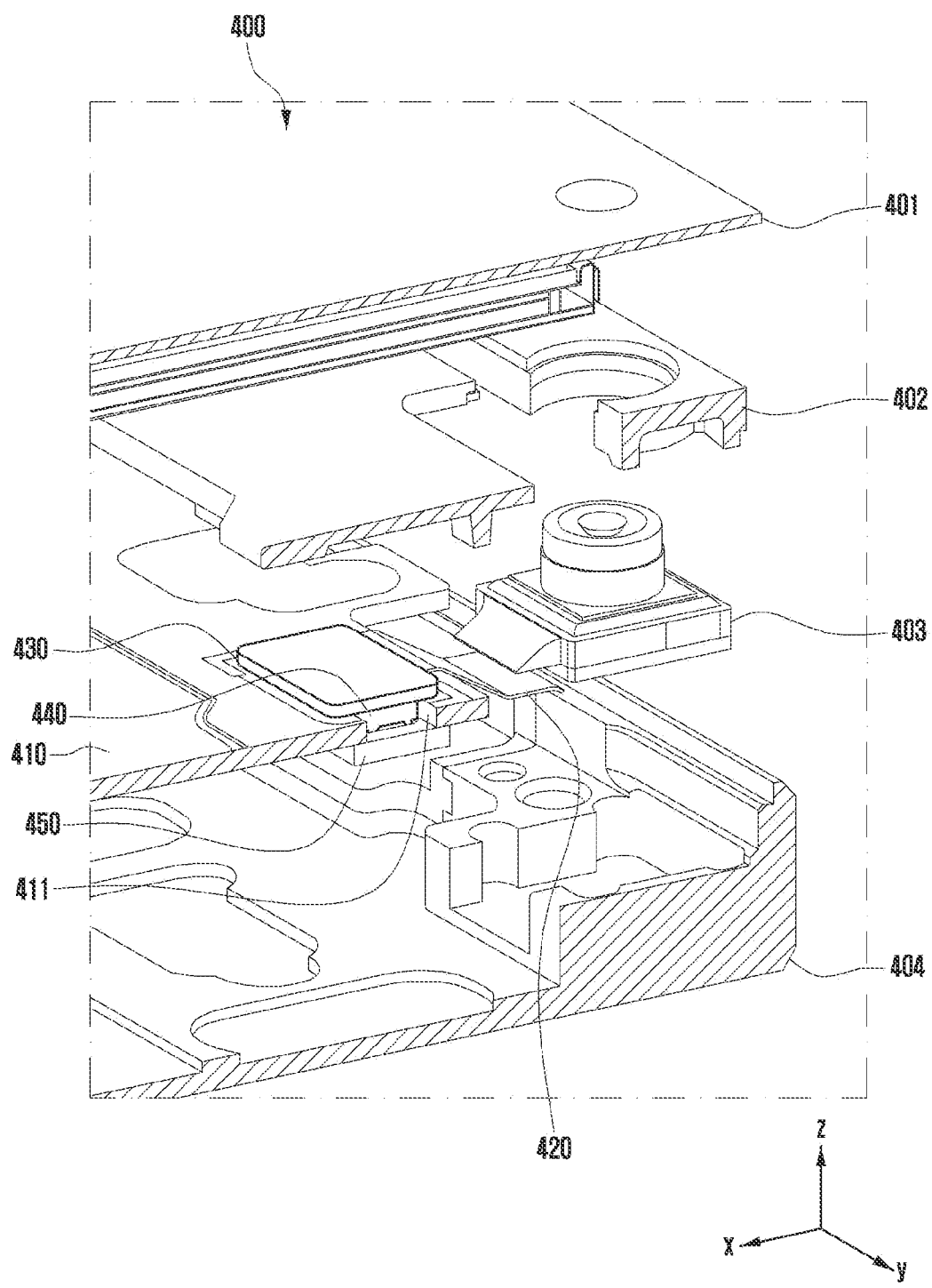
FIG. 4A is an exploded perspective view illustrating an example electronic device according to certain embodiments of the disclosure.

FIG. 4A is an exploded perspective view illustrating an electronic device according to certain embodiments of the disclosure.

Figure 4B:
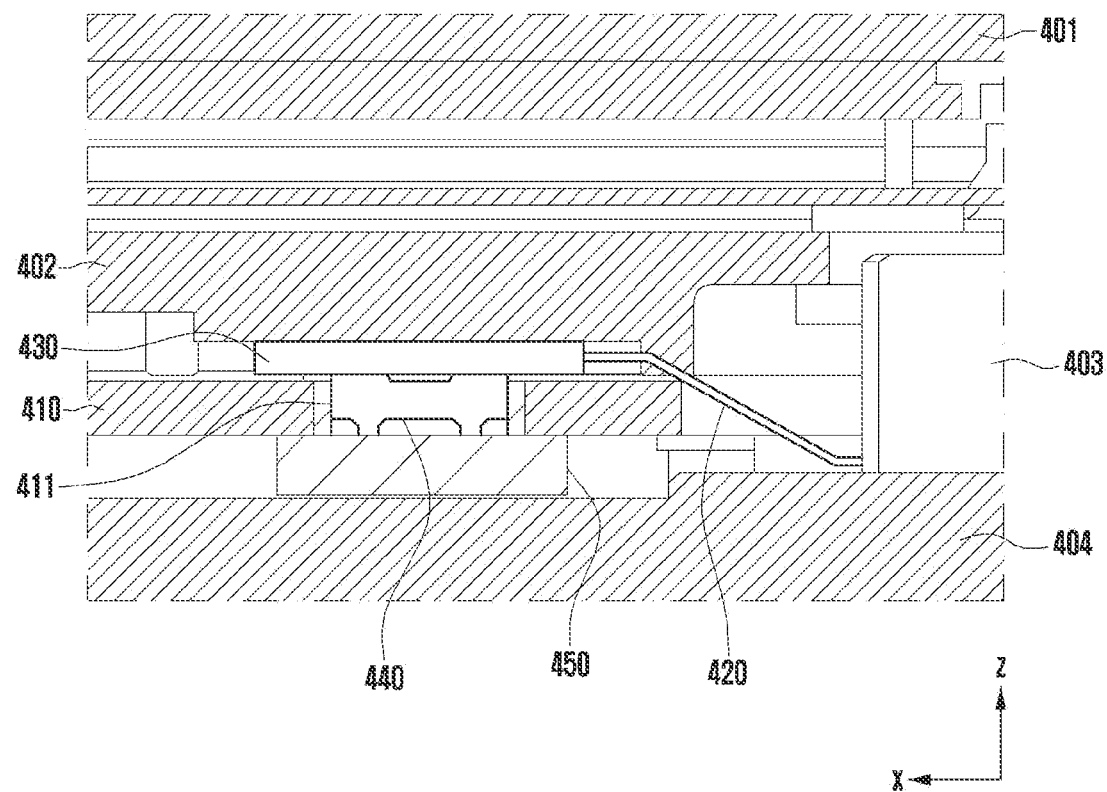
FIG. 4B is a cross-sectional view illustrating an example electronic device according to certain embodiments of the disclosure.

FIG. 4B is a cross-sectional view illustrating an electronic device according to certain embodiments of the disclosure.

FIGS. 4A and 4B are cross-sectional views taken along line A-A of FIG. 3.

With reference to FIGS. 4A and 4B, an electronic device 400 may include a display 401 (e.g., the display 201 of FIG. 2A), a front bracket 402, a first substrate 410 (e.g., the first printed circuit board 320 or the second printed circuit board 340 of FIG. 3), an electrical component 403 (e.g., camera), a cable 420 (e.g., the cable 322 of FIG. 3), a head part 430, a socket part 440, a through hole 411, and a rear bracket 404 (e.g., the support member 311 of FIG. 3).

The electrical component 403 is an active or passive component electrically operated to perform a function of an electronic device, and may include a processor, a sensor, a camera, a display driver integrated circuit (DDIC), a power management integrated circuit (PMIC), and a battery. The electrical component may be disposed on the first substrate 410 or electrically connected to the first substrate 410 by the cable 420. The first substrate 410 may be a printed circuit board. In some embodiments, the printed circuit board may include a laminated substrate including a plurality of substrates and/or an interposer substrate.

The head part 430 is formed in an end portion of the cable 420, and may be coupled to an object to which the cable 420 is to be connected, such as, for example, the socket part 440 (to be described later) formed on the first substrate 410 so as to form an electrical connection. A male connector 432 may be positioned in the head part 430. The socket part 440 is disposed at the first substrate 410 to which the cable 420 is connected and is electrically connected to the first substrate 410, and is coupled to the head part 430 so as to electrically connect the first substrate 410 with the cable 420, and to fix the head part 430. The through hole 411 may include a portion of the first substrate 410 that is formed so as to penetrate the first substrate 410 in a direction from an upper surface (i.e., meaning a surface of a portion of the first substrate 410 to which the head part 430 of the cable 420 is coupled and located, as described later below) to a lower surface of the first substrate 410 and which includes an internal space. At least a portion of the socket part 440 may be inserted and disposed in the through hole 411 formed in the first substrate 410. When the first substrate 410 is a laminated substrate, the through hole 411 may extend downward so as to penetrate the plurality of substrates and/or the interposer substrates included in the laminated substrate, and heights of the head part 430 and the socket part 440 may extend so as to correspond to an extended depth of the through hole 411. A detailed configuration of the head part 430 and the socket part 440 will be described later with reference to the drawings.

Figure 5A:
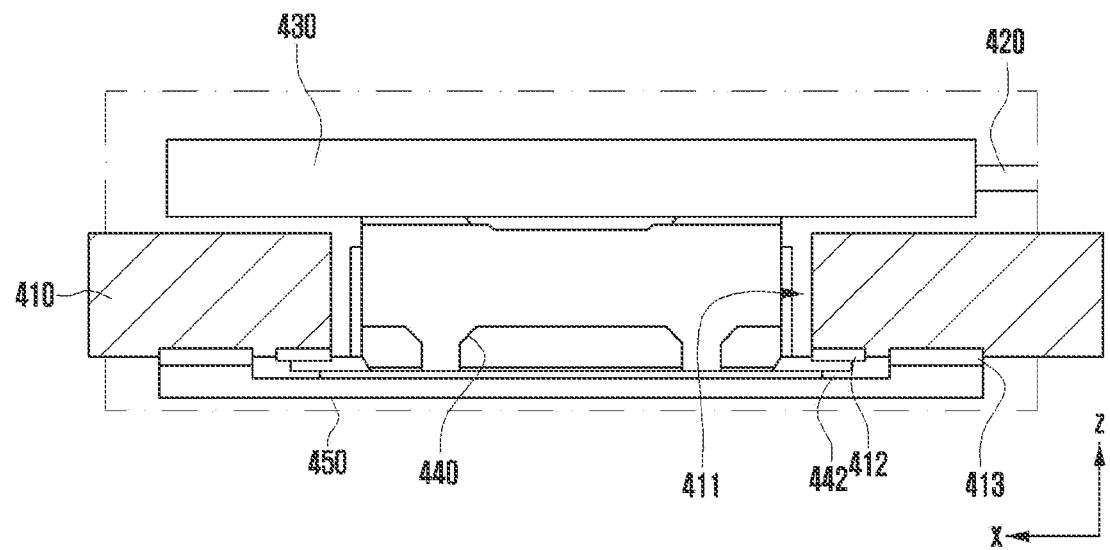
FIG. 5A is a side view illustrating a head part and a socket part of an example electronic device according to embodiments of the disclosure.

FIG. 5A is a side view illustrating ahead part 430 and a socket part 440 of an electronic device, according to embodiments of the disclosure.

Figure 5B:
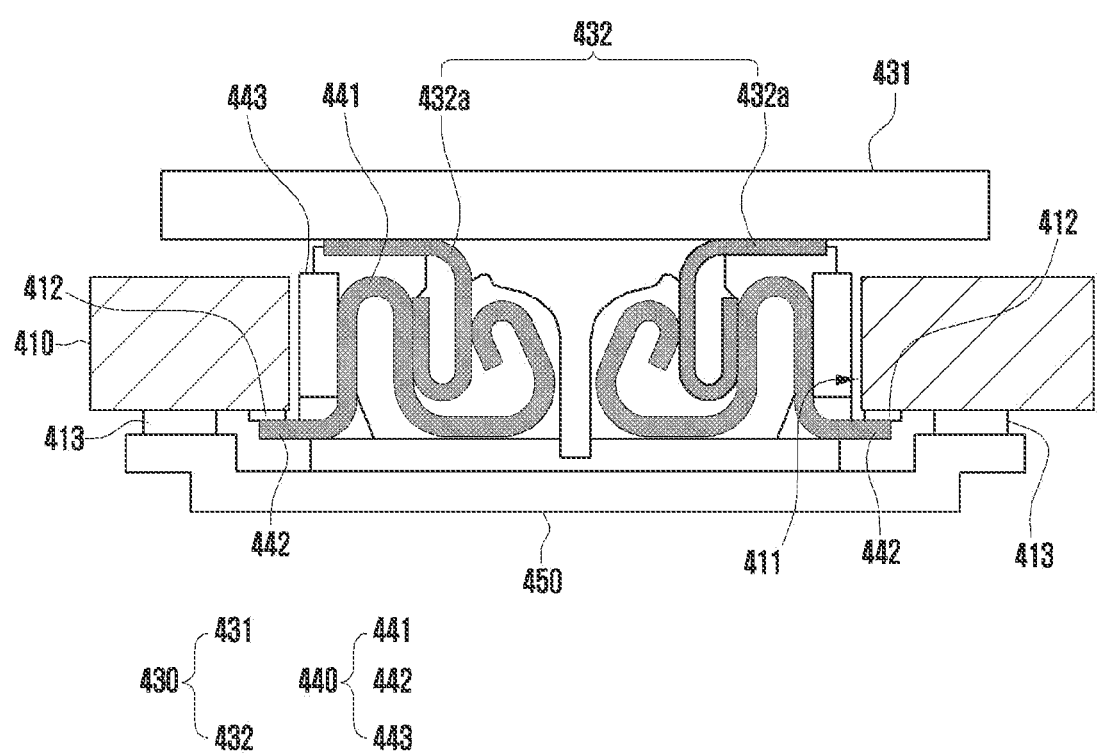
FIG. 5B is a side cross-sectional view illustrating an example socket part and a head part according to embodiments of the disclosure.

FIG. 5B is a side cross-sectional view illustrating a socket part 440 and a head part 430 according to embodiments of the disclosure.

Figure 5C:
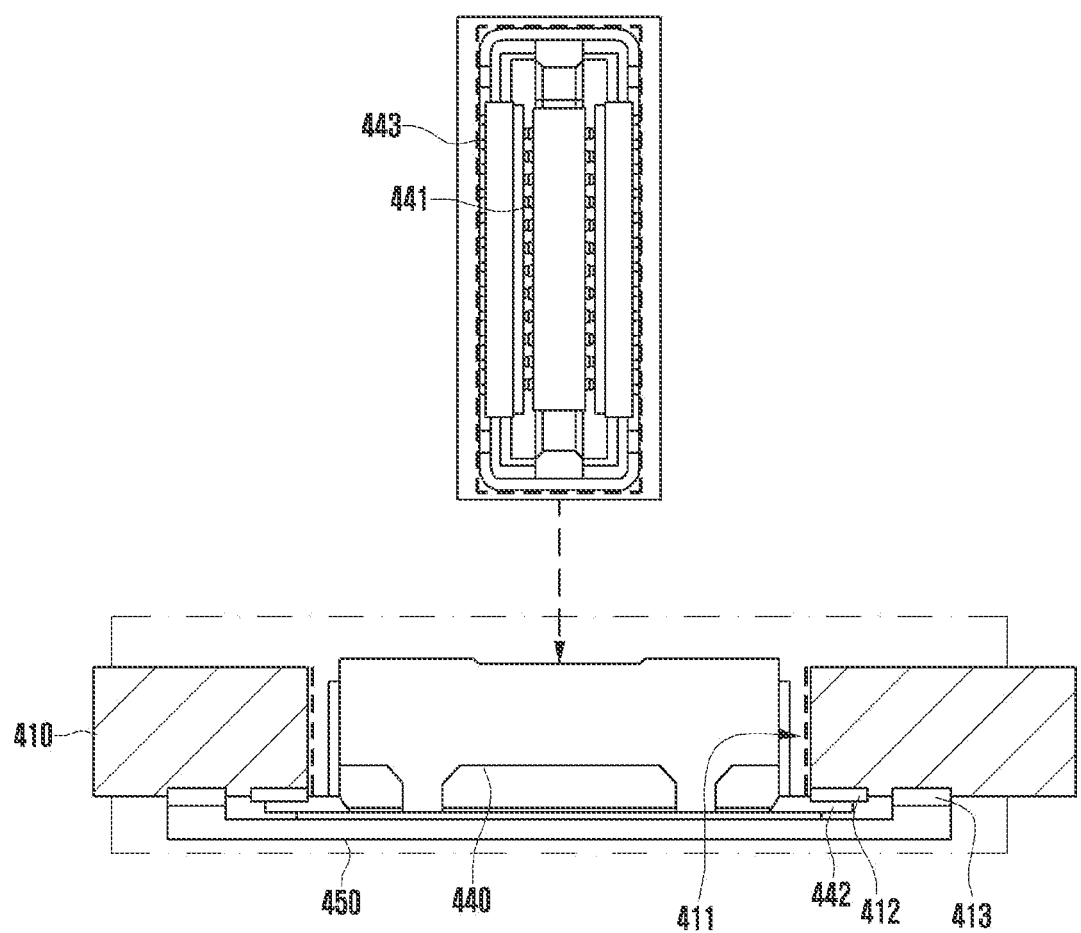
FIG. 5C is a plan view and a side view illustrating an example socket part according to embodiments of the disclosure.

FIG. 5C is a plan view and a side view illustrating a socket part 440 according to embodiments of the disclosure.

Figure 5D:
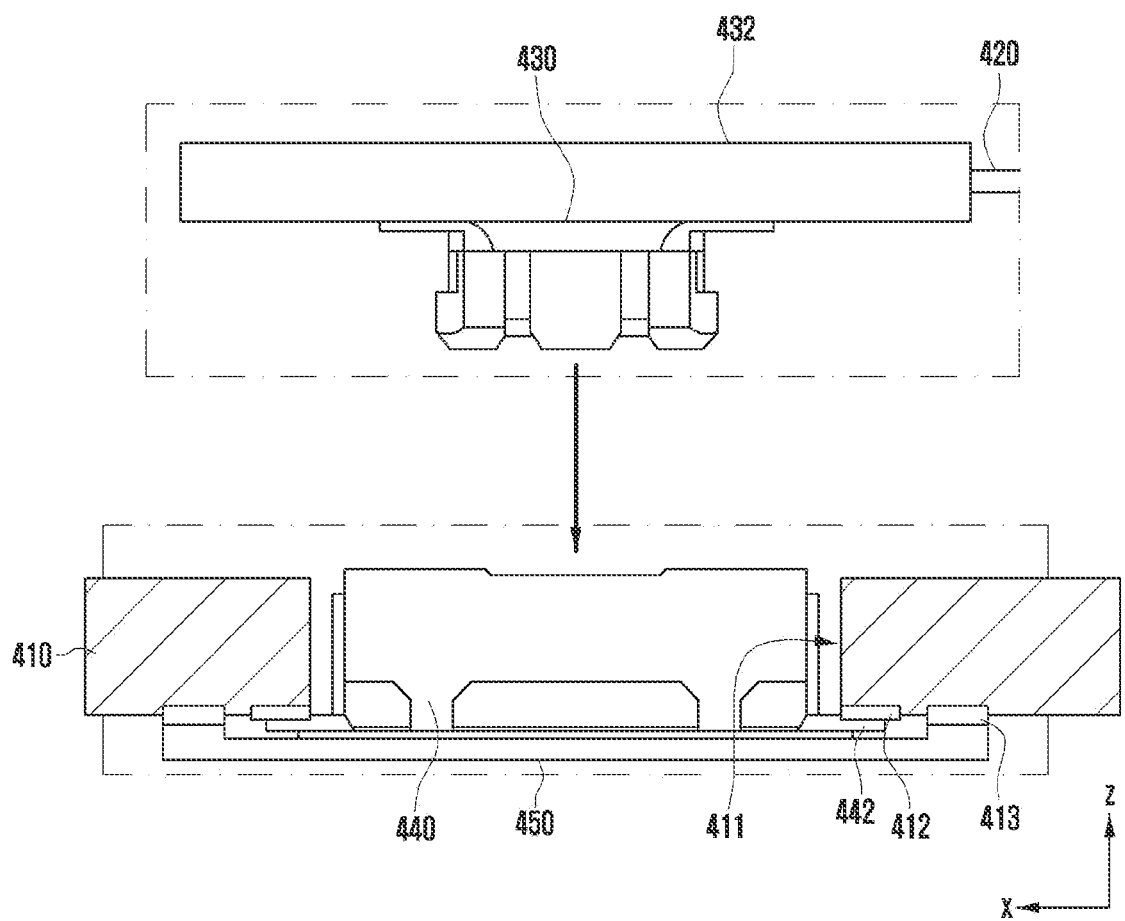
FIG. 5D is a side view illustrating coupling of an example head part and a socket part of an electronic device according to embodiments of the disclosure.

FIG. 5D is a side view illustrating coupling of a head part 430 and a socket part 440 of an electronic device according to embodiments of the disclosure.

With reference to FIGS. 5A and 5B, the first substrate 410 of the electronic device may include a through hole 411, a socket part 440 that is disposed inside the through hole 411, and the head part 430 positioned in an end portion of the cable 420 so as to be coupled to the socket part 440.

The head part 430 may be positioned in an end portion of the cable 420 so as to be coupled to the socket part 440, thereby forming an electrical connection. The head part 430 may include a male connector 432 for forming an electrical contact with a female connector 441 (to be described later) of the socket part 440, and a head stiffener 431 for protecting the head part 430 from any stress applied to the head part 430 during assembly the electronic device. The male connector 432 may include a plurality of male connector pins 432a. The male connector pins 432a may include a conductive material, and be arranged in one or more rows. An end portion of the male connector pin 432a may be hemmed or bent so as to form a curved surface, thereby stably establishing electrical contact with the female connector 441. In some embodiments, the male connector pins 432a may be arranged in two opposing rows. The male connector pins 432a in rows facing one another may be arranged so as to be symmetrical to each other. In other embodiments, the male connector pins 432a may be arranged in rows of four or more.

The through hole 411 may have a planar shape, corresponding to a planar shape of the socket part 440, and penetrate the first substrate 410 in a thickness direction, and have an area in which the socket part 440 is positioned therein. In some embodiments, a contact pad 412 for electrically bonding to the socket part 440 may be formed in an area around the through hole 411 on a lower surface of the first substrate 410. The contact pad 412 may include a conductive material including copper, gold, nickel, tin or an alloy thereof and plating.

In some embodiments, a support member 450 and/or an auxiliary substrate 460 (e.g., an auxiliary substrate 460 of FIG. 7A) for supporting the socket part 440 may be positioned in a lower portion of the through hole 411. Detailed implementations of the support member 450 and the auxiliary substrate 460 will be described later.

With reference to FIG. 5C, the socket part 440 may be positioned inside the through hole 411, electrically connected to the first substrate 410, and coupled to the head part 430 so as to electrically connect the cable 420 and the first substrate 410. The socket part 440 may include a female connector 441 for forming electrical contact with the male connector 432, a contact pin 442 extending laterally with respect to a lower surface of the first substrate 410 from the female connector 441 and electrically connected to the first substrate 410, and a socket housing 443 for providing an internal space for disposition of the female connector 441 and protecting and/or supporting the female connector 441. The contact pin 442 may extend laterally from a lower portion of the socket part 440 so as to be bonded to the contact pad 412, as formed on a lower surface of the first substrate 410. For bonding the contact pin 442 and the contact pad 412, soldering, spot welding, surface mount technology (SMT), or a technical implementation for forming an electrical bonding similar thereto may be used. With reference to FIG. 5B, the female connector 441 may include a metal material processed to stably form an electrical contact surface with the male connector 432 by pressing of the male connector 432, via elastic deformation when coupled with the male connector 432.

Because the socket part 440 is positioned inside the through hole 411, a disposition height of the socket part 440, the head part 430 (as coupled to an upper portion of the socket part 440), and the cable 420 may be lowered. Therefore, it may provide advantages enabling reduction of a thickness of the electronic device. Further, when a lateral force is applied to the cable 420, a corresponding amount of lateral force applied to the socket part 440, the head part 430, and the first substrate 410 may be reduced. Thus, there is an advantage that the risk of damage is reduced. Further, because the socket part 440 is positioned inside the through hole 411, more guidance is provided to the head part 430 when the through hole 411 is being coupled to the head part 430. Further, because risk of damage to the head part 430 is reduced, a thickness of the stiffener 431 of the head part 430 may be reduced, thereby reducing an overall thickness. In some embodiments, the height of the socket part 440 is greater than a thickness of the first substrate 410 in an area in which the through hole 411 is formed. Thus, the socket part 440 may be stably coupled to the head part 430.

With reference to FIG. 5D, the head part 430 may be coupled to the socket part 440 by pressing against the socket part 440 from an upper part (i.e., in the z-axis direction of FIG. 5D) of the first substrate 410. The head part 430 and the socket part 440 may be coupled via detachable coupling, such as by an interference fit, a clasp, a screw, or snap coupling.

Figure 6A:
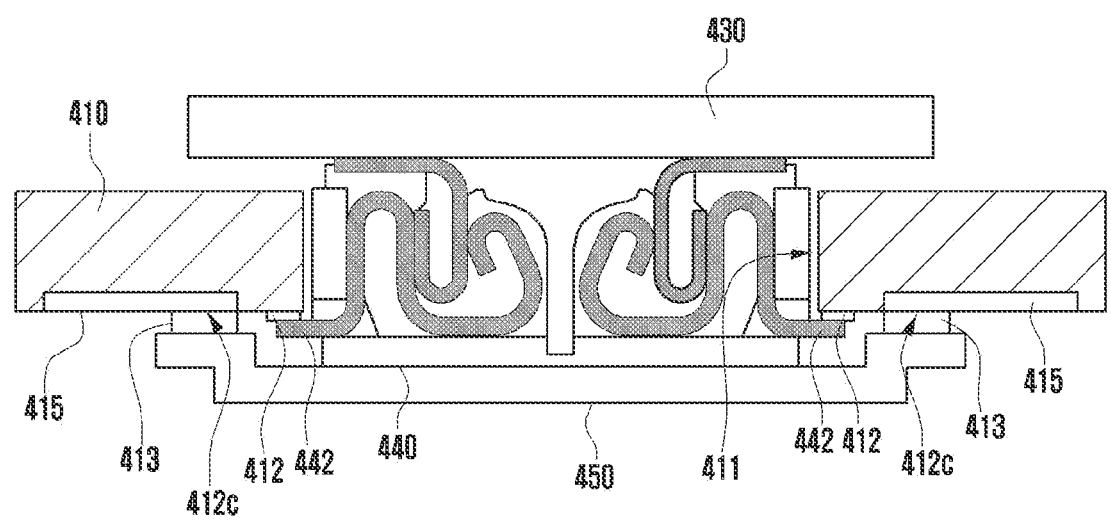
FIG. 6A is a cross-sectional view illustrating an example support member according to some embodiments of the disclosure.

FIG. 6A is a cross-sectional view illustrating a support member 450 according to some embodiments of the disclosure.

Figure 6B:
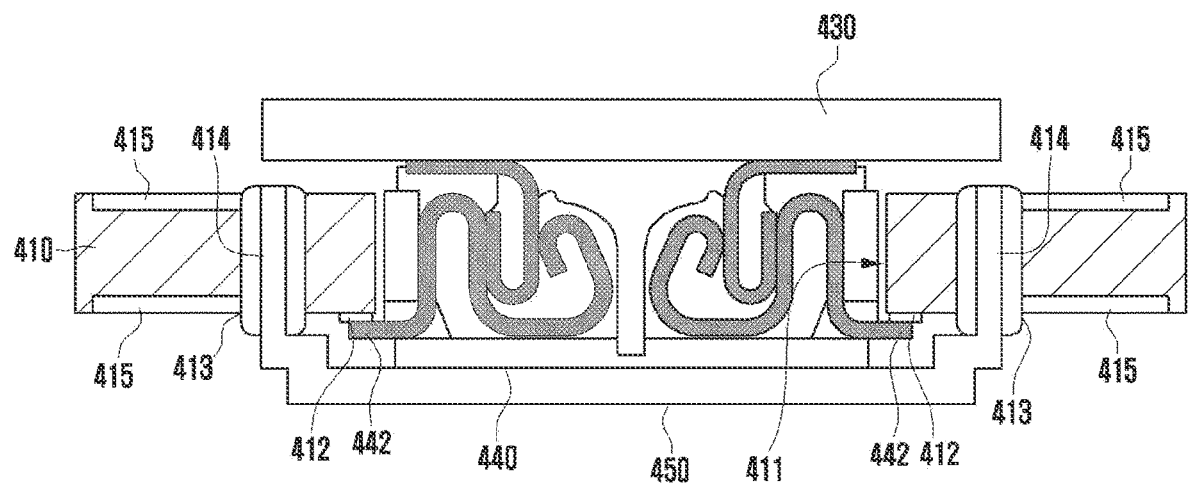
FIG. 6B is a cross-sectional view illustrating an example support member according to other embodiments of the disclosure.

FIG. 6B is a cross-sectional view illustrating a support member 450 according to other embodiments of the disclosure.

With reference to FIG. 6A, the support member 450 may be disposed in a bottommost portion of an area on a lower surface (e.g., assuming upwards in FIG. 6A is "higher" and downwards in FIG. 6A is "lower") of the first substrate 410 in which the socket part 440 is positioned. The support member 450 supports a bottommost portion of the socket part 440 to reduce the risk that the socket part 440 may be damaged or dropped, according to a pressure applied from the header part to the socket part 440, in order to couple the header part to the socket part 440 upon assembling the electronic device. The support member 450 may include a material such as at least one of metal, ceramic, or synthetic resin. The support member 450 may include a metal material such as stainless steel. Because the metal material has high specific strength and low modulus of elasticity, and the metal material is conductive, the metal material may provide an electro-magnetic interference (EMI) shielding effect for the socket part 440 and grounding of the circuit of the electronic device.

In some embodiments, the first substrate 410 may include a coupling pad 413 disposed in an area adjacent to the through hole 411 on a lower surface thereof (e.g., near an underside of the first substrate 410, assuming downwards in FIG. 6A is "lower"), which may be coupled to the support member 450. The coupling pad 413 of the support member 450 may include a conductive material including copper, gold, nickel, tin or an alloy thereof and plating. The support member 450 may be coupled to the coupling pad 413 by a method such as soldering, spot welding, or SMT. The support member 450 may be fixed to the lower surface of the first substrate 410 by being bonded to the coupling pad 413 to support the socket part 440. In another embodiment, the support member 450 may be coupled to the first substrate 410 by a fastening means such as a screw or a snap rivet.

In some embodiments, the first substrate 410 may include a plurality of ground wirings 415 for grounding electrical components of the electronic device, and the coupling pad 413 of the support member 450 may include a ground pad 412c electrically connected to the ground wirings. The support member 450 including a metal material may be connected to the ground wiring of the first substrate 410 through the ground pad 412c. Thus, the support member 450 may connect the plurality of ground wirings positioned around the through hole 411 to one another, thereby completing the ground circuit, and EMI noise signals may thus be sent through the ground. Thus, the support member 450 may have an EMI shielding effect.

With reference to FIG. 6B, in another embodiment, the first substrate 410 may include an anchor 414. The anchor 414 may penetrate the first substrate 410 in a thickness direction of the first substrate 410, and in an area of the first substrate 410 adjacent to the through hole 411. The anchor 414 may be coupled to the support member 450 to fix the support member 450 to the first substrate 410. Because the anchor 414 penetrates the first substrate 410 to so as to fix the support member 450 with respect to the entire thickness of the first substrate 410, a fixing force for the support member 450 may be improved. Further, the anchor 414 may electrically connect the support member 450 to a plurality of ground wirings 415 positioned at a lower surface, and an upper surface of the first substrate 410, and a central portion in a thickness direction of the first substrate 410.

Figure 7A:
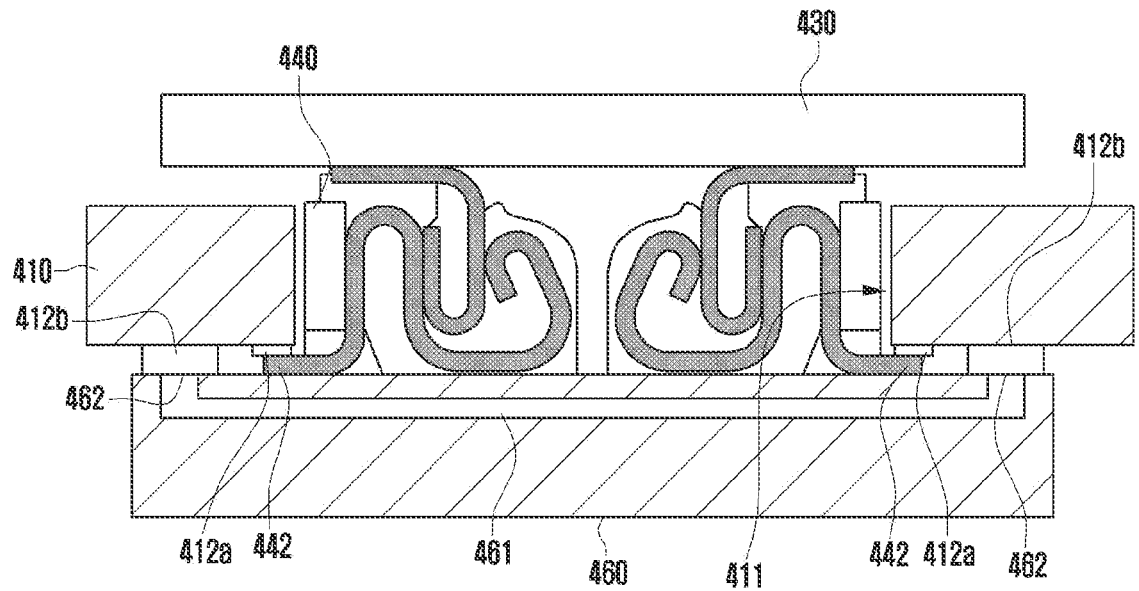
FIG. 7A is a cross-sectional view illustrating a socket part of an example electronic device according to other embodiments of the disclosure.

FIG. 7A is a cross-sectional view illustrating a socket part 440 of an electronic device according to other embodiments of the disclosure.

Figure 7B:
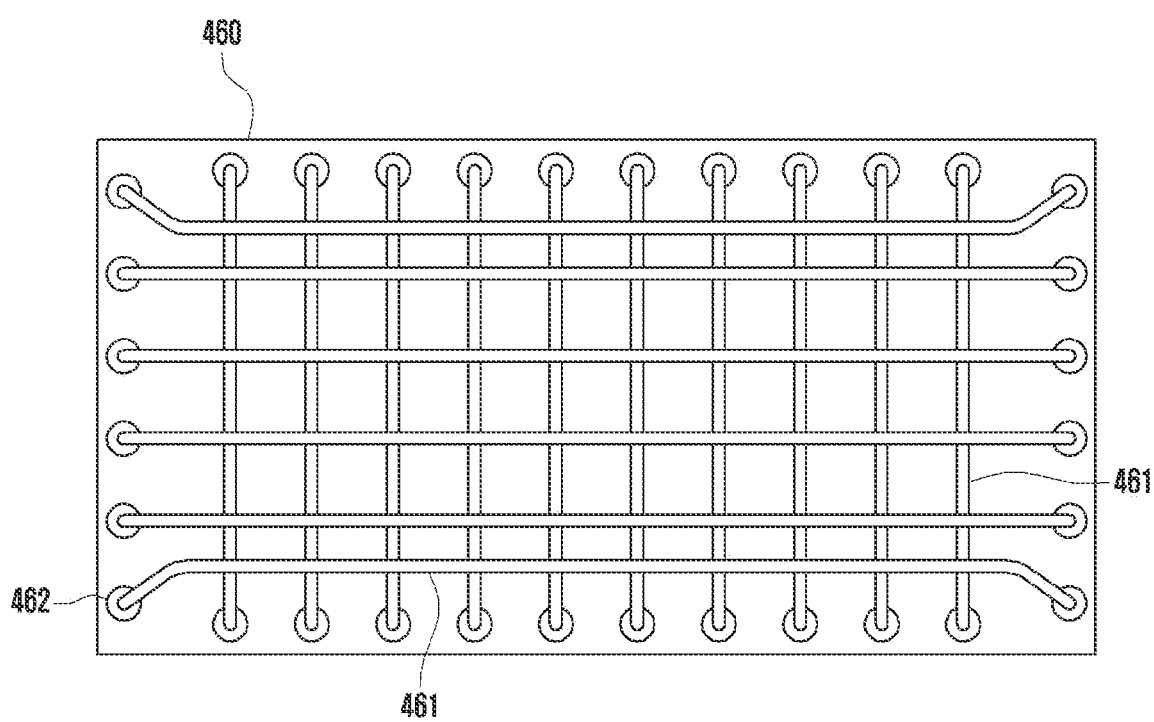
FIG. 7B is a plan view illustrating an example auxiliary substrate of an electronic device according to other embodiments of the disclosure.

FIG. 7B is a plan view illustrating an auxiliary substrate 460 of an electronic device according to other embodiments of the disclosure.

Figure 7C:
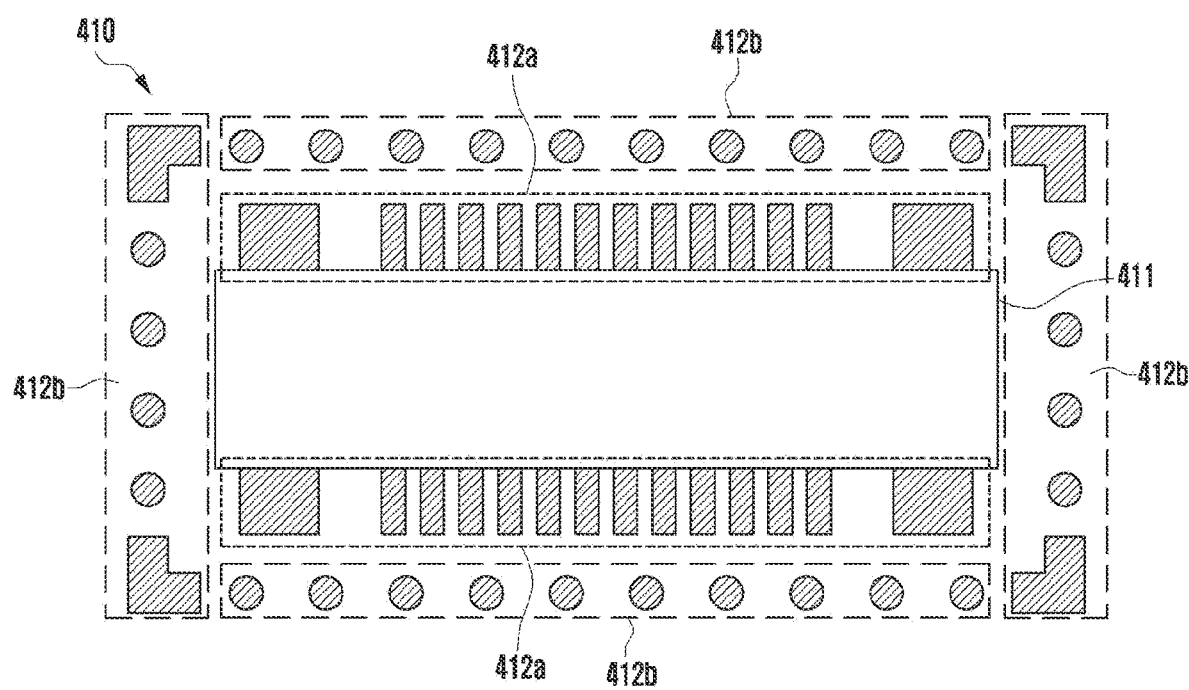
FIG. 7C is a plan view illustrating a contact pad of an example electronic device according to other embodiments of the disclosure.

FIG. 7C is a plan view illustrating a contact pad 412 of an electronic device according to other embodiments of the disclosure.

Figure 7D:
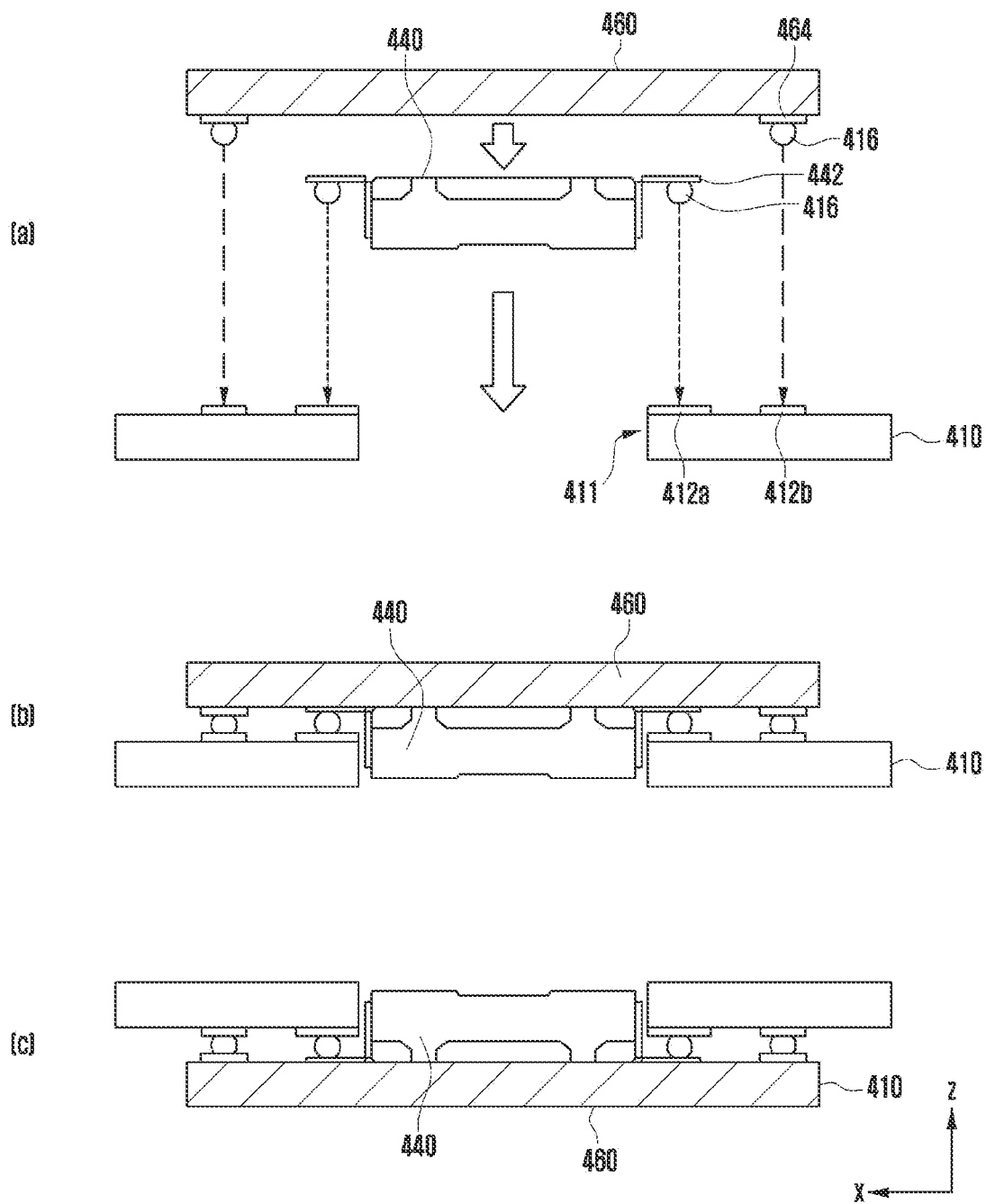
FIG. 7D is a side view illustrating a coupling relationship between a substrate, a socket part, and an auxiliary substrate of an example electronic device according to another embodiment of the disclosure.

FIG. 7D is a side view illustrating a coupling relationship between a first substrate 410, a socket part 440, and an auxiliary substrate 460 of an electronic device according to other embodiments of the disclosure.

With reference to FIGS. 7A and 7B, the electronic device may include an auxiliary substrate 460 positioned in a bottommost portion of the first substrate 410 (i.e., with the same up-down reference perspective as FIGS. 6A-6B). The auxiliary substrate 460 may be positioned in an area including the through hole 411 and a peripheral portion of the through hole 411 on the lower surface of the first substrate 410. The auxiliary substrate 460 may include a bypass wiring 461, and a bypass wiring contact pad 462 in which an electrical contact for connection of the bypass wiring 461 is formed may be formed on the auxiliary substrate 460. The bypass wiring 461 may be a circuit connecting circuits of the first substrate 410 that are otherwise cut off by the through hole 411 of the first substrate 410. The auxiliary substrate 460 may include a printed circuit board, a flexible printed circuit board (FPCB), an integrated circuit, a low temperature co-sintered ceramic (LTCC), or a similar substrate in which an electric circuit is formed. In some embodiments, the auxiliary substrate 460 may include a plurality of bypass wirings 461 oriented in different directions. The auxiliary substrate 460 may include a laminated substrate having a plurality of layers, and bypass wirings 461 oriented in different directions may be formed in each layer. In some embodiments, in order to save an internal space of the electronic device, the thickness of the auxiliary substrate 460 may be thinner than that of the first substrate 410. Because a structure of the circuit (e.g., such as the bypass wiring 461 disposed at the auxiliary substrate 460) is simple, the circuit may be implemented so as to have a desired thinness. For example, the auxiliary substrate 460 may include a flexible printed circuit board in which a bypass wiring 461 is formed by printing a conductor on a plastic plate, resulting in a desired thinness. Because the auxiliary substrate 460 includes a flexible printed circuit board, the bypass wiring 461 may be applied while reducing an increase in thickness due to the addition of the auxiliary substrate 460. In another embodiment, the auxiliary substrate 460 may be produced using a residual substrate generated when the first substrate 410 is produced by cutting a substrate mother sheet. By producing the auxiliary substrate 460 using the residual substrate, waste may be reduced and material costs may be reduced.

With reference to FIG. 7C, the contact pad 412 of the lower surface of the first substrate 410 may include a first contact pad 412a bonded to the contact pin 442 of the socket part 440, and second contact pads 412b connected to the circuit of the first substrate 410. The first contact pad 412a may include an electrical contact point for connecting the cable 420 and the first substrate 410 through the socket part 440 and the head part 430. The second contact pads 412b may electrically connect to the bypass wiring 461 by bonding to the bypass wiring contact pad 462 when the auxiliary substrate 460 is coupled to the lower portion of the first substrate 410. The circuit of the first substrate 410, as cut off by the through hole 411, may be electrically connected to the bypass wiring 461 through the second contact pads 412b and the bypass wiring contact pad 462 at a point in the periphery of the through hole 411, and the bypass wiring 461 may be reconnected to the first substrate 410 through the second contact pads 412b and the bypass wiring contact pad 462 positioned at different points in the periphery of the through hole. Accordingly, the circuit of the first substrate 410 can bypass the disconnection caused by the through hole 411. In some embodiments, the first contact pad 412a may be formed in an area relatively close to the through hole 411 and the socket part 440 positioned within the through hole 411 among areas in which the contact pad 412 is formed, and the second contact pads 412b may be positioned at a periphery of an area in which the first contact pad 412a is formed.

In case of forming the through hole 411 in the first substrate 410, the circuit around the through hole 411 may bypass the through hole 411. In order to dispose the circuit so as to bypass the through hole 411, an area of an additional first substrate 410 may be utilized, which may interfere with downsizing of the first substrate 410. The bypass wiring 461 of the auxiliary substrate 460 may reduce requisite utilization of an area of an additional first substrate 410 for bypassing the through hole 411, by allowing the bypass through a lower portion of an area of the substrate in which the through hole 411 of the first substrate 410 is formed.

With reference to FIG. 7D (a), a solder ball 416 may be utilized to bond with the first contact pad 412a, the second contact pads 412b of the first substrate 410 may be attached to the socket part 440 and the auxiliary substrate 460, and the socket part 440 and the auxiliary substrate 460 may be seated on lower surface of the first substrate 410 in an inverted state, such that the lower surface faces upward. With reference to FIG. 7D (b), when in a state in which the socket part 440 and the auxiliary substrate 460 are seated on the lower surface of the first substrate 410, the solder ball 416 is heated and melted. Thus, the socket part 440 and the auxiliary substrate 460 may be bonded to the first contact pad 412a and the second contact pads 412b. An electric resistance, a laser, or an oven may be used as methods of heating the solder ball 416. With reference to FIG. 7D (c), the first substrate 410 in which bonding is completed may be returned to an original position thereof, so that an upper surface thereof faces upwards again. By the above-described process, the socket part 440 and the auxiliary substrate 460 are bonded to the first substrate 410; thus, the socket part 440 and the auxiliary substrate 460 may be simultaneously bonded to the first substrate 410 through one heating. During a bonding process of the socket part 440 and the auxiliary substrate 460, various other electrical components disposed on the first substrate 410 are simultaneously bonded, thereby simplifying the process.

Figure 8:
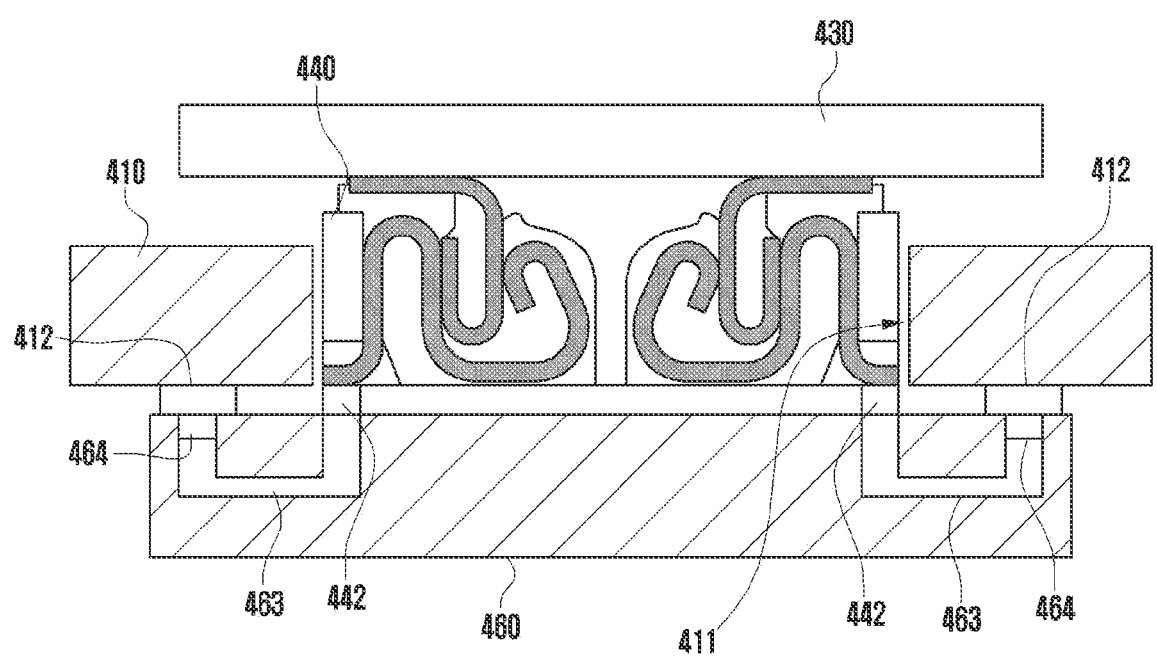
FIG. 8 is a cross-sectional view illustrating a socket part and an auxiliary substrate of an example electronic device according to another embodiment of the disclosure.

FIG. 8 is a cross-sectional view illustrating a socket part 440 and an auxiliary substrate 460 of an electronic device according to another embodiment of the disclosure.

With reference to FIG. 8, the auxiliary substrate 460 may include a socket connection wiring 463 for electrically connecting the contact pin 442 of the socket part 440 to the first substrate 410, and an auxiliary substrate contact pad 464 for bonding the socket connection wiring 463 and the contact pad 412 of the first substrate 410. Accordingly, the socket part 440 may be connected to the first substrate 410 through the auxiliary substrate 460. In an embodiment in which the socket part 440 is electrically connected to the first substrate 410 through the auxiliary substrate 460, a comparatively larger portion of the socket part may be inserted into the through hole. Thus, the socket part 440 may be so disposed while reducing the degree of external protrusion thereof from the lower surface of the first substrate 410 of the through hole, as compared to an embodiment in which the socket part 440 is directly connected to the contact pad 412 as formed at the lower surface of the substrate. Further, because the socket part 440 is disposed at the auxiliary substrate 460, a degree of freedom in disposing the first substrate 410 may be increased.

Figure 9:
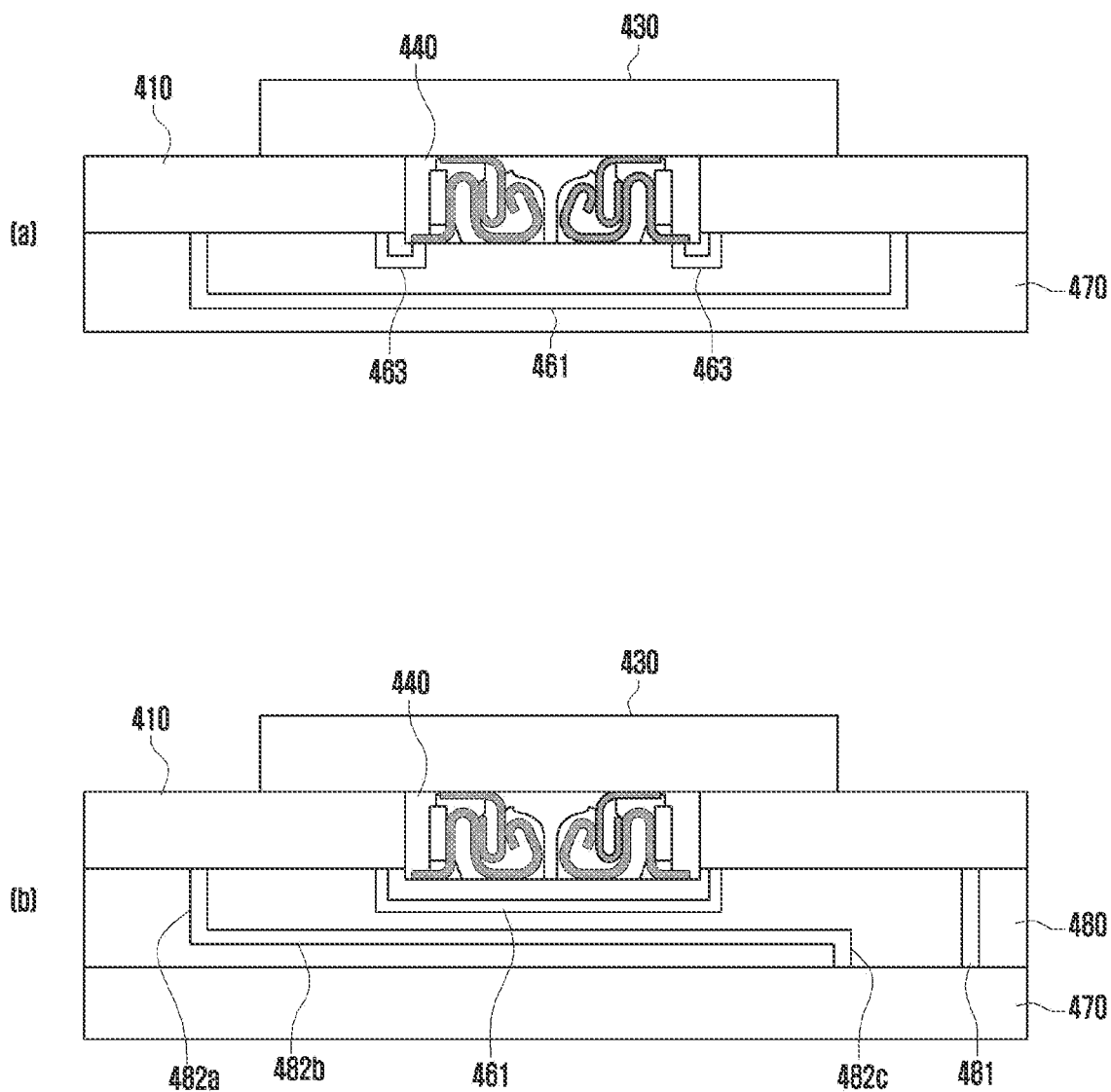
FIG. 9 is a cross-sectional view illustrating a socket part and a second substrate of an example electronic device according to another embodiment of the disclosure.

FIG. 9 is a cross-sectional view illustrating a socket part 440 and a second substrate 470 of an electronic device according to another embodiment of the disclosure.

With reference to FIG. 9, the electronic device may include a second substrate 470 disposed in a lower portion of the first substrate 410. The second substrate 470 may include a circuit for providing an additional disposition space for installation of electrical components such as a coprocessor, a storage device, an antenna, a PMIC, and/or a DDIC, and for electrically connecting the first substrate 410 with the above-described additional electrical components. The second substrate 470 may include bypass wiring 461 and/or socket connection wiring 463. Regarding the bypass wiring 461 and the socket connection wiring 463, the description of the auxiliary substrate 460 may be referred to as long as there is no contradiction.

In some embodiments, an interposer substrate 480 may be disposed between the first substrate 410 and the second substrate 470. The interposer substrate 480 may include a conductive via 481 penetrating the interposer substrate 480 in a thickness direction, so as to electrically connect the first substrate 410 and the second substrate 470 and/or a connection wiring 482 for electrically connecting an electrical component disposed at the first substrate 410 and an electrical component disposed at the second substrate 470. The connection wiring 482 may include a first via 482a electrically connected to the first substrate 410, a second via 482c electrically connected to the second substrate 470, and horizontal wiring 482b for connecting the first via 482a and the second via 482c. The interposer substrate 480 including the connection wiring 482 may be a multilayer substrate that includes a plurality of layers.

The interposer substrate 480 may include a bypass wiring 461 and/or a socket connection wiring 463. Regarding the bypass wiring 461 and the socket connection wiring 463, the description of the auxiliary substrate 460 provided previously may be referred to, as long as there are no contradictions.

The second substrate 470 may help miniaturization of the electronic device by reducing an area of the first substrate 410, and the interposer substrate 480 may increase the freedom with which components may be arranged on the first substrate 410 and the second substrate 470. By thus locating the bypass wiring 461 and/or the socket connection wiring 463 at the second substrate 470 or the interposer substrate 480, the bypass wiring 461 and/or the socket connection wiring 463 may be so disposed without incurring increases in overall thickness by the auxiliary substrate 460.

Figure 10A:
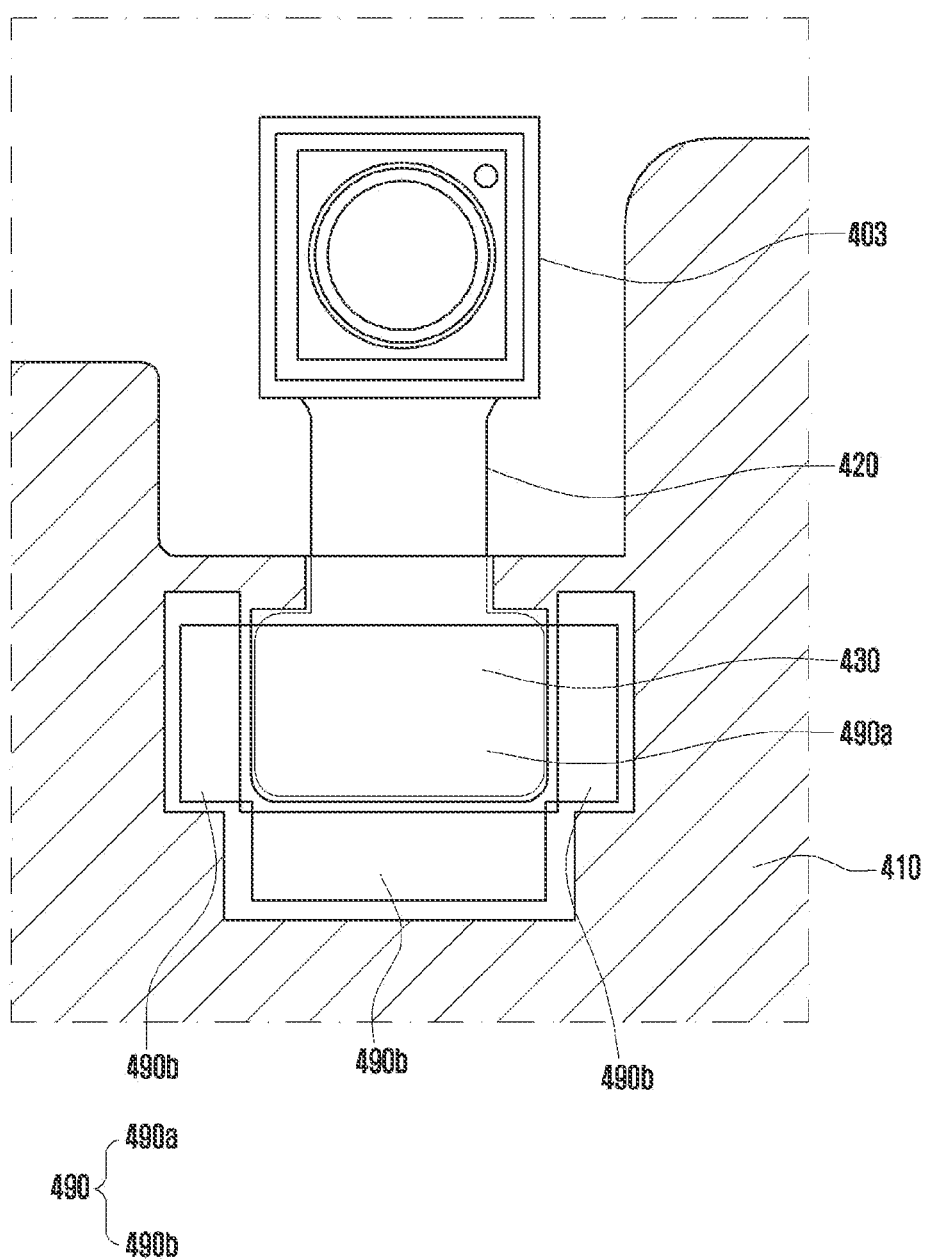
FIG. 10A is a plan view illustrating a shielding member of an example electronic device according to some embodiments of the disclosure.

FIG. 10A is a plan view illustrating a shielding member 490 of an electronic device according to some embodiments of the disclosure.

Figure 10B:
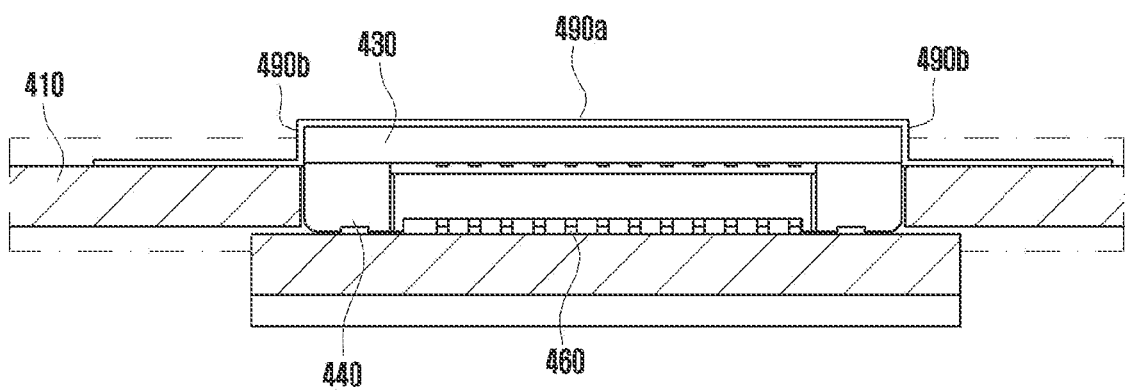
FIG. 10B is a side view illustrating a shielding member of an example electronic device according to some embodiments of the disclosure.

FIG. 10B is a side view illustrating a shielding member 490 of an electronic device according to some embodiments of the disclosure.

With reference to FIGS. 10A and 10B, the shielding member 490 may include a plate-shaped member of a desired thinness covering an upper surface and a side surface of the head part 430 on a surface of the first substrate 410, and/or an upper part of the first substrate 410 adjacent to the head part 430. The shielding member 490 may be electrically connected to a ground wiring of the first substrate 410.

The shielding member 490 may be a plate-shaped member made having the desired thinness, formed of a conductive material that shields EMI generated in an area in which the first substrate 410 and the cable 420 are coupled, and/or EMI introduced from the external environment. The shielding member 490 may include a metal foil, a metal mesh, or a thin metal-coated synthetic resin plate. The metal foil or metal mesh may be freely formed from a general-purpose material. In some embodiments, the shielding member 490 may be formed by cutting from the above-described thin plate-shaped material into a shape, for example, a T-shape or a plus (+) shape having a plurality of side shielding parts 490b radially extended from a central portion 490a. The shielding member 490 may be bent such that the central portion 490a covers an upper surface of the head part and the side shielding parts shield the head part and the plurality of side surfaces.

When the mounting height of the head part 430 is sufficiently high, a gap between the side shielding parts 490b of the shielding member 490 covering the side surface of the head part 430 may be widened, thereby increasing the risk of EMI noise leakage. According to certain embodiments of the disclosure, because the shielding member 490 is positioned inside the through hole 411 formed in the first substrate 410, a height at which the head part 430 and the socket part 440 protrude from the first substrate 410 may be reduced. Accordingly, the risk of leakage of EMI noise from the shielding member 490 may be reduced, and a shielding performance of the shielding member 490 may thus be improved.

Embodiments disclosed in this document disclosed in this specification and drawings merely present specific examples to easily describe the technical content according to the embodiments disclosed in this document and to help the understanding of the embodiments disclosed in this document, and are not intended to limit the embodiments disclosed in this document. Accordingly, in addition to the embodiments disclosed herein, all changes or modifications derived from the technical ideas of certain embodiments disclosed in this document should be construed as being included in the embodiments disclosed in this document.

What is claimed is:

1. An electronic device including a plurality of electrical components, the electronic device comprising:
    a first substrate including a circuit electrically connected to an electrical component from among the plurality of electrical components, wherein a through hole is formed penetrating the first substrate in a thickness direction from an upper surface of the first substrate;
    a cable;
    a head part coupled to an end portion of the cable;
    a socket part including a contact pin of which at least a portion is disposed inside the through hole and extending with respect to a lower surface of the first substrate, the socket part being electrically connected to the first substrate, and coupled to the head part in a direction of the upper surface of the first substrate; and
    a second substrate positioned on below an area of the lower surface of the first substrate in which the through hole is formed,
    wherein the first substrate comprises:
    a plurality of contact pads formed at the lower surface of the first substrate, and electrically connected to the circuit of the first substrate,
    wherein the second substrate includes wiring coupled to at least two of the plurality of contact pads so as to interconnect the at least two of the second contact pads.

2. The electronic device of claim 1, wherein the first substrate comprises a contact pad formed in an area in which the contact pin of the socket part is positioned on the lower surface of the first substrate, based on a direction in which the head part is coupled and bonded to the contact pin of the socket part, and
    wherein the electrical component is disposed within an opening formed in a front bracket of the electronic device, in which the opening is distinct from the through hole.

3. The electronic device of claim 1, further comprising a support member coupled to the lower surface of the first substrate, and supporting the socket part from a lower portion thereof.

4. The electronic device of claim 1, wherein the plurality of contact pads comprises:
    a first contact pad formed at the lower surface of the substrate, and bonded to the contact pin of the socket part; and
    a plurality of second contact pads coupled to the wiring of the second substrate.

5. The electronic device of claim 1, wherein the second substrate comprises socket connection wiring bonded to the first substrate and the contact pin of the socket part, and
    wherein the contact pin is electrically connected to the first substrate through the socket connection wiring of the second substrate.

6. The electronic device of claim 1, wherein a thickness of the second substrate is thinner than that of the first substrate.

7. The electronic device of claim 1, wherein the second substrate comprises a flexible printed circuit board (FPCB).

8. The electronic device of claim 1, further comprising an interposer substrate disposed between the first substrate and the second substrate,
    wherein the interposer substrate comprises a via electrically connecting the first substrate and the second substrate.

9. The electronic device of claim 1, further comprising a shielding member covering an upper surface and a side surface of the head part, and including a conductive material.

10. The electronic device of claim 3, wherein the support member includes a metal material.

11. The electronic device of claim 3, wherein the first substrate comprises an anchor affixed to the first substrate by penetration of the first substrate in the thickness direction, and
    wherein the anchor fixes the support member to the lower surface thereof.

12. The electronic device of claim 10, wherein the first substrate comprises ground wiring that grounds the electrical component, and
    wherein a coupling pad of the support member comprises a ground pad electrically connected to the ground wiring.

13. The electronic device of claim 8, wherein the interposer substrate comprises socket connection wiring bonded to the first substrate and the contact pin of the socket part, and
    wherein the contact pin is electrically connected to the first substrate through the socket connection wiring of the interposer substrate.

14. The electronic device of claim 9, wherein the shielding member is formed by cutting the conductive material into a shape, including a central portion and a plurality of side shielding parts extending radially from the central portion, and bending at least some of the plurality of side shielding parts to cover the side surface of the head part.

15. The electronic device of claim 14, wherein the shielding member is formed by further cutting the conductive material on a thin plate into a T-shape or a plus (+) shape.

* * * * *